United States Patent [19]

Grünwald et al.

[11] Patent Number: 4,485,129
[45] Date of Patent: Nov. 27, 1984

[54] METHOD OF THROUGH-CONTACTING A CIRCUIT BOARD

[75] Inventors: Werner Grünwald, Gerlingen; Kurt Schmid, Ditzingen, both of Fed. Rep. of Germany

[73] Assignee: Robert Bosch GmbH, Stuttgart, Fed. Rep. of Germany

[21] Appl. No.: 518,795
[22] PCT Filed: Nov. 10, 1982
[86] PCT No.: PCT/EP82/00241
 § 371 Date: Jun. 23, 1983
 § 102(e) Date: Jun. 23, 1983
[87] PCT Pub. No.: WO83/01886
 PCT Pub. Date: May 26, 1983

[30] Foreign Application Priority Data
Nov. 17, 1981 [DE] Fed. Rep. of Germany ....... 3145584

[51] Int. Cl.$^3$ ............................ B05D 5/12; B05C 1/00
[52] U.S. Cl. ...................................... 427/97; 427/125; 118/205; 118/254
[58] Field of Search ................. 427/97, 105, 230, 125; 118/205, 243, 215, 254

[56] References Cited
U.S. PATENT DOCUMENTS 3,301,175  1/1967  Polichette ...................... 101/372 X
3,605,616  9/1971  Pannier .............................. 101/216
3,701,317 10/1972  Miyamoto et al. ................. 101/170

OTHER PUBLICATIONS
IBM Technical Disclosure Bulletin, vol. 21, No. 9, (Feb. 1979).

Primary Examiner—Michael R. Lusignan
Assistant Examiner—K. E. Jaconetty
Attorney, Agent, or Firm—Frishauf, Holtz, Goodman & Woodward

[57] ABSTRACT

A method is proposed for through-contacting a circuit board (17), in which the wall (15) of a bore (16) is provided with a metallizing of a conductive thick-film paste (12). The application of the metallizing is effected in a particularly advantageous manner by imprinting the electrically conductive paste (12) by means of an elastically deformable imprinting stamp (11, 12).

13 Claims, 3 Drawing Figures

METHOD OF THROUGH-CONTACTING A CIRCUIT BOARD

STATE OF THE ART

The invention is based on a method of through-contacting a circuit board in which the wall of a bore is provided with an electrically conductive coating. A through-contacted circuit board of this kind is known, for instance from German Patent Disclosure Document DE-OS No. 2 920 091, wherein it is explained that the roughened side wall of a bore is provided with a metallizing. A metallizing of this kind is applied in a known manner by means of cathodic sputtering and then is galvanically reinforced.

Other known methods for producing electrically conductive coatings on a surface are performed with rollon or brush-on methods. Screen-printing methods are also known for applying electrically conductive films.

A method is furthermore known from German Patent Disclosure Document DE-OS No. 3 014877 for coating an exhaust oxygen sensor electrode (lambda sensor), in which an electrically conductive liquid is introduced in a metered manner into a hollow body and distributed in the hollow body by means of an inflatable, finger-like part. Finally, electrically conductive pastes of the type under discussion are known, for instance from German Patent Disclosure Documents DE-OS No. 29 13 633 and DE-OS No. 30 02 112. Of the known conductive pastes, those having a high precious-metal content, preferably including silver, are particularly well suited for applying the through-contacting film according to the invention. Suitable conductive pastes are furthermore available in commerce from the Du Pont de Nemours company in the U. S. or in Düsseldorf, Federal Republic of Germany, an example being an AgPd paste having the code number 9473. This paste can be mixed as needed with a thinner sold by the same company and having the code number 9180. A suitable silver paste is sold under the code number 1110S by the ESL company in Pennsauken, N.J., for example.

ADVANTAGES OF THE INVENTION

The method according to the invention and having the coating effected by imprinting an electrically conductive past by means of an elastically deformable printing stamp makes it possible, in a particularly advantageous manner, to coat round or otherwise-shaped bores in circuit boards uniformly while dispensing the paste to be applied in a precisely metered manner. The proposed method is extremely economical when compared with previously conventional methods, since such expensive manufacturing techniques as vacuum processes are dispensed with. Because the pastes to be applied can be metered exactly, substantial savings in cost can be realized because of the savings in expensive precious metals.

As a result of the use of a printing block, backing support, and silver or silver-palladium paste, advantageous further developments of and improvements to the method disclosed in the main claim are possible. Imprinting the paste by means of a sharply pointed stamp, in particular, assures a complete coating and uniform application of the paste in the bore, because an imprinting stamp of this kind adapts itself particularly well to the inside contour of a bore. Picking up the printing paste from a flat printing block has the advantage that introducing the printing paste into the depression of the printing block can be accomplished particularly easily, for instance by brushing it on. The depth to which the printing block is etched is preferably on the order of 35 to 120 μm. Particularly in the through-contacting of bores the diameter of which is small in proportion to the thickness of the circuit board, the use of a backing support has proved useful in order to press the elastically deformable imprinting stamp, with the paste to be applied, reliably against the entire surface of the bore. In bores of relatively slight depth, this backing support can be dispensed with at no disadvantage.

DRAWING

One exemplary embodiment of the invention is shown schematically in the drawing and explained in further detail in the following description. Shown are:

FIG. 1, the pickup of the conductive paste from a printing block by an elastically deformable imprinting stamp;

FIG. 2, the introduction of the imprinting stamp into the bore of a circuit plate; and FIG. 3, the deformation of the imprinting stamp.

DESCRIPTION OF THE EXEMPLARY EMBODIMENT

Figure 1:
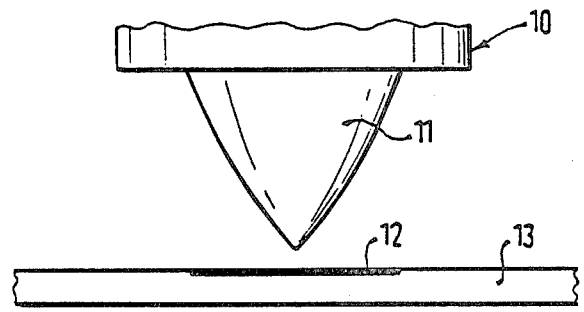

In FIG. 1, reference numeral 10 identifies an imprinting stamp the tip of which comprises a silicon rubber element 11, which picks up the paste 12, which is predetermined in terms of its shape and quantity, from a printing block 13.

Figure 2:
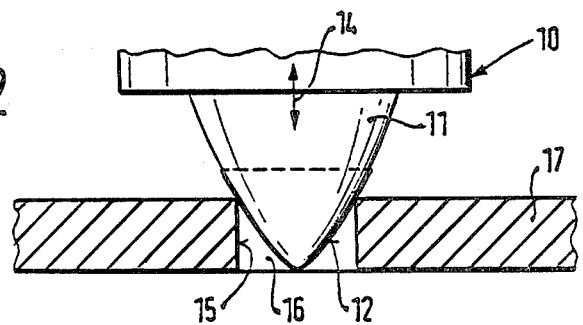
Figure 3:
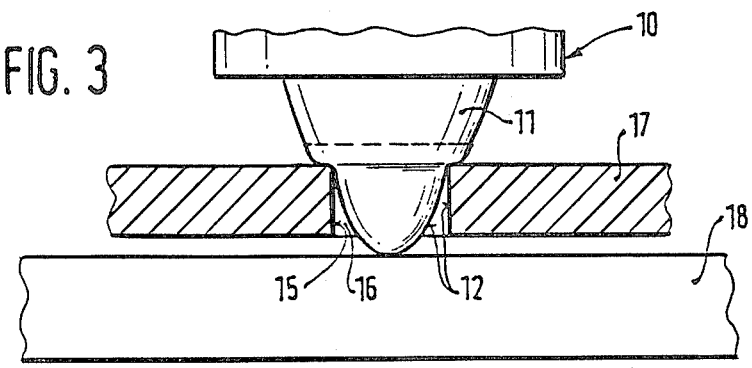

In FIGS. 2 and 3, identical elements are provided with the same reference numerals. The paste adhering to the silicon rubber element 11 is transferred onto the wall 15 of a bore 16 in a circuit board 17 by means of a translational movement as indicated by the arrow 14 in FIG. 2.

In FIG. 3, the imprinting process is sketched shortly before its conclusion; dot-dash lines indicate the application of the conductive paste on the inner wall 15 of the bore as well as in the peripheral zone on the upper end face of the bore 16. FIG. 3 additionally shows a bottom plate 18, which serves as a backing support for the silicon rubber element 11 of the imprinting stamp 10 and presses the silicon rubber element 11 against the wall 15 in the lower portion of the bore.

The method according to the invention for through-contacting a conductor track is fundamentally as follows, according to the steps shown:

The electrically conductive paste 12 is brushed onto a flat printing block 13 and is limited to the etched area by being wiped with a squeegee. The paste 12 is picked up from the printing block 13 by means of a vertical movement of the imprinting stamp 10, whereupon the silicon rubber element deforms and is coated in the vicinity of its tip with the paste 12. For the method according to the invention a sharply pointed silicon rubber element 11 has proved to be particularly useful, and its point can furthermore be adapted to the diameter of the bore which is to be imprinted. The thinner the bore, the more sharply pointed the silicon rubber element 11 should be. However, instead of a sharply pointed silicon rubber element 11, a cylindrical silicon rubber element can also be used, which by means of a backing support is deformed and enlarged in its radius in such a manner that it comes to rest against the inner wall 15 of the bore 16.

FIG. 3 shows the actual imprinting procedure. After being introduced into the bore 16, the silicon rubber element 11 comes to rest on the upper rim of the bore 16 and deforms in the manner shown; its pressure against the inner wall 15 of the bore can be further reinforced by underlaying it with a bottom plate 18. The bottom plate 18 may either rest directly on the circuit board 17 or be disposed a slight distance away from the circuit board 17, so as to assure a satisfactory coating of the lower portion of the wall 15 in the case where the diameter of the hole is small in proportion to the thickness of the circuit board 17. While in contact with the wall 15, the paste 12 is transferred by the silicon rubber element 11 onto the wall 15.

Particularly good results have been attained with the method according to the invention when the ratio between the diameter of the bore and the thickness of the circuit board was on the order of magnitude of 1:1; however, satisfactory imprinting can also be assured when the thickness ratio is 1:2, at least if the silicon rubber element 11 is deformed, beginning at the outlet opening of the bore 16, by means of a backing support in the form of the bottom plate 18. If the bottom plate 18 is disposed spaced apart from the circuit board 17, it can even be attained that the paste 12 is also transferred onto the underside of the circuit board 17 around the bore 16.

With the method according to the invention, bores 16 in any arbitrary circuit boards 17 can be provided with a conductive coating. In the case of a circuit board 17 of a material resistant to high temperatures, such as ceramic or enamelled steel, a particularly suitable coating paste 12 is a paste available in commerce comprising a mixture of silver and paladium, which is stoved in air at high temperatures of approximately 850° C. For imprinting a bore 16 in a circuit board 17 which is made of a material less resistant to high temperatures, such as plastic, a particularly suitable paste is a silver paste which is stoved in air at temperatures of approximately 200° C. Suitable silver pastes are described in the literature mentioned at the outset herein, for example, and are likewise available in commerce in the form of thick-film pastes.

We claim:

1. A method of electrically conductively through-contacting a circuit board formed with bores or openings (16) therethrough, characterized by the steps of
   applying an electrically conductive paste (12) to an elastically deformable printing stamp (10,11) which is shaped to penetrate into the bore or opening (16);
   inserting said stamp at least partially into said bore; and
   deforming said stamp in such a manner as to forcibly imprint the electrically conductive paste (12) on the walls (15) of said bore.

2. A method as defined in claim 1, wherein said applying step includes deforming a sharply pointed, elastically deformable element (11) of said imprinting stamp (10) against a flat printing block (13) having electrically conductive paste (12) thereon.

3. A method as defined by claim 1 or 2, characterized in that the printing block (13) has an etching depth of between 35 μm and 120 μm, preferably of approximately 80 μm.

4. A method as defined by claim 1 or claim 2, characterized in that a silicon rubber element (11) is made to rest on the rim of the bore (16) and is simultaneously, from the other side of the bore (16), deformed by a backing support (18) and pressed against the wall (15) of the bore (16).

5. A method as defined by claim 1, characterized in that a circuit board (17) of ceramic or of enamelled steel is printed with a silver-paladium paste, which is then stoved in air at from 800° C. to 900° C.

6. A method as defined by claim 1, characterized in that a circuit board (17) of plastic is printed with a silver paste, which is then stoved in air at approximately 150° C. to 250° C.

7. A method as defined by claim 3, characterized in that a silicon rubber element (11) is made to rest on the rim of the bore (16) and is simultaneously, from the other side of the bore (16), deformed by a backing support (18) and pressed against the wall (15) of the bore (16).

8. A method as defined in claim 2, characterized in that a circuit board (17) of ceramic or of enamelled steel is printed with a silver-palladium paste, which is then stoved in air at from 800° C. to 900° C.

9. A method as defined by claim 2, characterized in that a circuit board (17) of plastic is printed with a silver paste, which is then stoved in air at approximately 150° C. to 250° C.

10. A method as defined in claim 3, characterized in that a circuit board (17) of ceramic or of enamelled steel is printed with a silver-palladium paste, which is then stoved in air at from 800° C. to 900° C.

11. A method as defined by claim 3, characterized in that a circuit board (17) of plastic is printed with a silver paste, which is then stoved in air at approximately 150° C. to 250° C.

12. A method as defined in claim 4, characterized in that a circuit board (17) of ceramic or of enamelled steel is printed with a silver-palladium paste, which is then stoved in air at from 800° C. to 900° C.

13. A method as defined by claim 4, characterized in that a circuit board (17) of plastic is printed with a silver paste, which is then stoved in air at approximately 150° C. to 250° C.

* * * * *